(12) United States Patent
Wirth et al.

(10) Patent No.: US 11,984,333 B2
(45) Date of Patent: May 14, 2024

(54) METHODS AND SYSTEMS FOR TEMPERATURE CONTROL FOR A SUBSTRATE

(71) Applicant: APPLIED MATERIALS, INC., Santa Clara, CA (US)

(72) Inventors: Paul Zachary Wirth, Kalispell, MT (US); Kiyki-Shiy Shang, Mountain House, CA (US); Mikhail Taraboukhine, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/093,763

(22) Filed: Jan. 5, 2023

(65) Prior Publication Data

US 2023/0154773 A1   May 18, 2023

Related U.S. Application Data

(63) Continuation of application No. 16/867,362, filed on May 5, 2020, now Pat. No. 11,551,951.

(51) Int. Cl.
*H01L 21/67* (2006.01)

(52) U.S. Cl.
CPC .. *H01L 21/67248* (2013.01); *H01L 21/67017* (2013.01); *H01L 21/67103* (2013.01)

(58) Field of Classification Search
CPC ......... H01L 21/67248; H01L 21/67017; H01L 21/67103; H01L 21/67109; H01L 21/6831
See application file for complete search history.

(56) References Cited

U.S. PATENT DOCUMENTS

| 6,094,334 A | 7/2000 | Bedi et al. |
| 6,847,014 B1 | 1/2005 | Benjamin et al. |

(Continued)

FOREIGN PATENT DOCUMENTS

| CN | 1473452 A | 2/2004 |
| CN | 101283624 A | 10/2008 |

(Continued)

OTHER PUBLICATIONS

PCT International Search Report and Written Opinion for International Application No. PCT/US2021/030967 dated Aug. 30, 2021,12 pages.

(Continued)

*Primary Examiner* — Karen Kusumakar
(74) *Attorney, Agent, or Firm* — Lowenstein Sandler LLP

(57) ABSTRACT

A direct current (DC) power is supplied to heating elements embedded in zones of a substrate support assembly (SSA) of a processing chamber. A determination is made, based on a voltage measured across the heating elements and a current measured through the heating elements as the DC power is supplied to the heating elements, that the temperature of the SSA does not satisfy a temperature condition. A zone of the SSA that is at a temperature that does not correspond to a target temperature for the zone based on the temperature condition is identified based on the measured voltage and the measured current. The DC power supplied to the heating elements embedded within the identified zone is modified to cause the temperature of the zone to be modified to the target temperature and the temperature of the substrate support assembly to satisfy the temperature condition.

20 Claims, 7 Drawing Sheets

(56) References Cited

U.S. PATENT DOCUMENTS

| | | |
|---|---|---|
| 6,921,724 B2 | 7/2005 | Kamp et al. |
| 9,275,887 B2 | 3/2016 | Matyushkin et al. |
| 2005/0045618 A1 | 3/2005 | Ito |
| 2005/0173404 A1 | 8/2005 | Benjamin et al. |
| 2005/0211485 A1 | 9/2005 | Inui et al. |
| 2007/0007276 A1 | 1/2007 | Steger |
| 2007/0258186 A1 | 11/2007 | Matyushkin et al. |
| 2009/0223452 A1 | 9/2009 | Nasman et al. |
| 2009/0274590 A1 | 11/2009 | Willwerth et al. |
| 2011/0147363 A1 | 6/2011 | Yap et al. |
| 2012/0285619 A1 | 11/2012 | Matyushkin et al. |
| 2013/0161305 A1 | 6/2013 | Ptasienski et al. |
| 2013/0256966 A1 | 10/2013 | Volfovski et al. |
| 2015/0228513 A1 | 8/2015 | Parkhe et al. |
| 2015/0371881 A1 | 12/2015 | Du Bois et al. |
| 2017/0236733 A1 | 8/2017 | Leeser |
| 2017/0322546 A1 | 11/2017 | Waldmann et al. |
| 2017/0372928 A1* | 12/2017 | Yamada ............... H05B 1/0233 |
| 2019/0159291 A1 | 5/2019 | Ptasienski et al. |
| 2020/0051789 A1* | 2/2020 | Linebarger, Jr. ..... H05B 1/0233 |

FOREIGN PATENT DOCUMENTS

| | | |
|---|---|---|
| CN | 101887865 A | 11/2010 |
| CN | 103563065 A | 2/2014 |
| CN | 104247001 A | 12/2014 |
| CN | 105474382 A | 4/2016 |
| CN | 107204306 A | 9/2017 |
| JP | 2001-118662 A | 4/2001 |
| JP | 2004-529486 A | 9/2004 |
| JP | 2013-508968 A | 3/2013 |
| JP | 2015-092580 A | 5/2015 |
| JP | 5823915 B2 | 11/2015 |
| JP | 2018502443 A | 1/2018 |
| JP | 2019004027 | 1/2019 |
| JP | 2019530208 A | 10/2019 |
| KR | 20130115209 A | 10/2013 |
| KR | 10-2018-0003984 A | 1/2018 |
| KR | 2018-0001475 A | 1/2018 |
| WO | 2016069808 A1 | 5/2016 |
| WO | 2018034896 A | 2/2018 |
| WO | 2019104048 A | 5/2019 |
| WO | 2019104060 A | 5/2019 |

OTHER PUBLICATIONS

International Search Report and Written Opinion of the International Application No. PCT/US2017/014233 dated Apr. 25, 2017, 15 pages.

Vijay D. Parkhe, U.S. Appl. No. 15/409,362, titled "Sensor System for Multi-Zone Electrostatic Chuck," filed Jan. 18, 2017.

* cited by examiner

400

```
Supply a first direct current (DC) power to a heating element embedded in a zone of a
substrate support assembly 410
              ↓
Measure a voltage across the heating element and a current through the heating element
                                      420
              ↓
Determine a temperature of the zone of the substrate support assembly based on the voltage
across the heating element and the current through the heating element 430
              ↓
Determine a temperature difference between the temperature and a target temperature for
the zone 440
              ↓
Determine a second DC power to deliver to the heating element to achieve the target
temperature based at least in part on the temperature difference 450
              ↓
Supply the second DC power to the heating element to cause the temperature of the zone to
be modified to the target temperature 460
```

```
Measure voltage and current for heating element 510
              ↓
Compute a resistance of the heating element using the measured current and voltage 512
              ↓
Input the resistance into a function or a lookup table that relates resistance of the heating
element to the temperature values 514
              ↓
Determine a temperature for the zone that corresponds to the temperature of the heating
element 520
```

Determine a resistance of a heating element based on a measured voltage and current of power transmitted to the heating element 710

Determine, based on the determined resistance of the heating element, a temperature of a zone including the heating element 720

Measure the temperature of the zone using a temperature sensor 730

Compare the determined temperature of the zone to the measured temperature of the zone 740

Determine that a difference between the determined temperature of the zone and the measured temperature of the zone exceeds a threshold difference 750

Re-calibrate a relationship between the resistance of a heating element and a temperature of the zone including the heating element 760

FIG. 7

METHODS AND SYSTEMS FOR TEMPERATURE CONTROL FOR A SUBSTRATE

RELATED APPLICATION

This application is a continuation application of and claims priority to, U.S. patent application Ser. No. 16/867,362, filed May 5, 2020, which is hereby incorporated by reference herein in its entirety for all purposes.

TECHNICAL FIELD

Embodiments of the present disclosure relate, in general, to electronic device manufacturing and more particularly to a system for temperature control for a substrate and methods for using the same.

BACKGROUND

Defects can occur during the processing of a substrate as a result of poor temperature control of the substrate and/or an environment surrounding the substrate. For example, during an etch process, a difference in temperature across the surface of a substrate can result in an uneven amount of material being etched away across the surface of the substrate. In another example, during a deposition process, a difference in temperature across the surface of the substrate can result in uneven deposition of material across the surface of the surface of the substrate. The accuracy of temperature measurements contributes to an ability to precisely control a temperature of the substrate. Current technology relies on temperature sensors (e.g., thermocouples) embedded within a substrate support assembly supporting a substrate during processing to determine a temperature of the substrate. However, delays and other defects in transmission of feedback information from the embedded temperature sensors prevents accurate, real-time measurements of the temperature of the substrate. Further, typical substrate support assemblies include fewer embedded temperature sensors than zones of the substrate support assembly. For example, a substrate support assembly can include five or more zones and as few as two embedded temperature sensors. As a result, one embedded temperature sensor is relied upon to measure a temperature of two or more zones of the substrate support assembly, which prevents accurate, real-time temperature measurements for each zone of the substrate support assembly.

SUMMARY

Some of the embodiments described cover a method including supplying a first direct current (DC) power to a heating element embedded in a zone of a substrate support assembly included in a processing chamber. The method further includes measuring a voltage across the heating element and a current through the heating element. The method further includes determining, based on the voltage across the heating element and the current through the heating element, a temperature of the zone of the substrate support assembly. The method further includes determining a second DC power to deliver to the heating element to achieve the target temperature. The method further includes supplying the second DC power to the heating element to cause the temperature of the zone to be modified to the target temperature.

In some embodiments, an apparatus includes a DC power source operatively coupled to a heating element embedded in a zone of a substrate support assembly included in a processing chamber. The apparatus further includes a controller operatively coupled to the heating element and to the DC power source. The controller is configured to cause the DC power source to supply a first DC power to the heating element. The controller is further configured to measure a voltage across the heating element and a current through the heating element. The controller is further configured to determine, based on the voltage across the heating element and the current through the heating element, a temperature of the zone of the substrate support assembly. The controller is further configured to determine, based on the determined temperature of the zone, a target temperature for the zone. The controller is further configured to determine a second DC power to deliver to the heating element to achieve the target temperature. The controller is further configured to cause the DC power source to supply the second power to the heating element to cause the temperature of the zone to be modified to the target temperature.

In some embodiments, an electronics device manufacturing system includes a processing chamber including a substrate support assembly. The substrate support assembly includes one or more heating elements each embedded in the zones of the substrate support assembly. The electronics device manufacturing system further includes a DC power source configured to supply DC power to each heating element. The electronics device manufacturing system further includes a controller operatively coupled to each heating element, the DC power source, and the system controller. The controller is configured to cause the DC power source to supply a first DC power to a heating element of the one or more heating elements embedded into a corresponding zone of the substrate support assembly. The controller is further configured to measure a voltage across the heating element and a current through the heating element. The controller is further configured to determine, based on the voltage across the heating element and the current through the heating element, a temperature of the corresponding zone of the substrate support assembly. The controller is further configured to determine, based on the determined temperature of the corresponding zone, a target temperature for the corresponding zone. The controller is further configured to determine a second DC power to deliver to the heating element to achieve the target temperature. The controller is further configured to cause the DC power source to supply the second power to the heating element to cause the temperature of the corresponding zone to be modified to the target temperature.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4 is a flow chart of a method for controlling a temperature of a zone of a substrate support assembly, according to aspects of the present disclosure.

FIG. 5 is a flow chart of a method for determining a temperature of a zone of a substrate support assembly, according to aspects of the present disclosure.

FIG. 7 is a flow chart of a method for re-calibrating a relationship between a determined resistance of a heating element and a temperature of a zone including the heating element, according to aspects of the present disclosure.

DETAILED DESCRIPTION OF EMBODIMENTS

Figure 1:
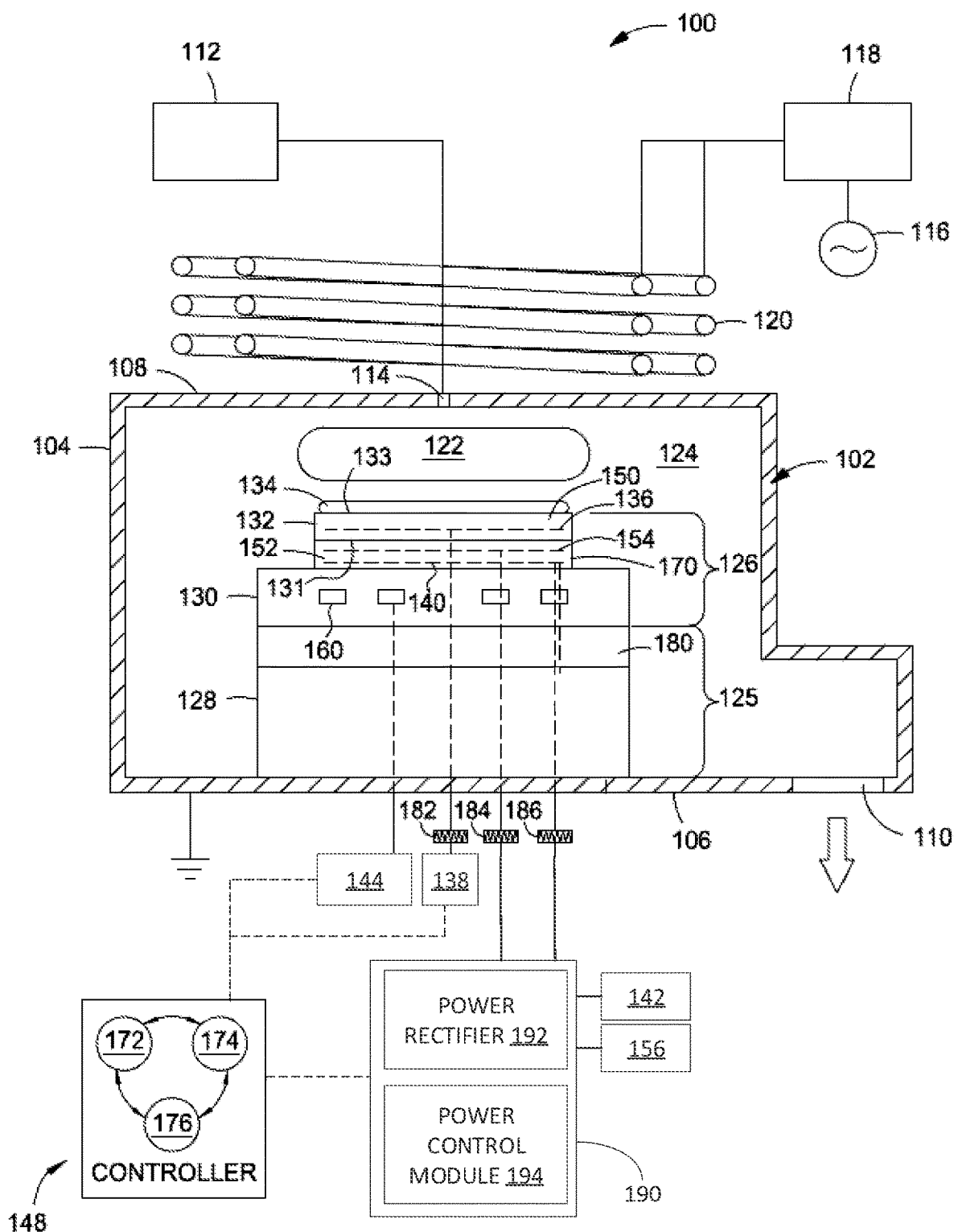
FIG. 1 is a cross-sectional schematic side view of a processing chamber having one embodiment of a substrate support assembly, according to aspects of the present disclosure.

Implementations described herein provide a temperature controller for temperature control of a substrate during processing at a processing chamber. The temperature controller can be configured to provide power to one or more heating elements embedded within a substrate support assembly supporting the substrate during processing. One or more heating elements can be embedded within a zone of the substrate support assembly. Each zone can correspond to a portion of the substrate. The temperature controller can increase, decrease, or maintain an amount of power provided to the one or more heating elements to heat the one or more zones to a target temperature.

In some embodiments, the temperature controller can include a power rectifier. The temperature controller can be connected to one or more power sources. In some embodiments, a power source can be an alternating current (AC) power source. In such embodiments, the power rectifier of the temperature controller can convert AC power received from the AC power source to direct current (DC) power, and can transmit the DC power to one or more heating elements. In other or similar embodiments, the power can be a DC power source. The temperature controller 190 can facilitate transmitting DC power from the DC power source to the one or more heating elements.

A power control module can measure a voltage across a heating element, and/or a current through the heating element, as power is transmitted to the heating element. The measured voltage and current values can be used to determine a resistance value for the heating element. The temperature controller can determine, based on the resistance value for the heating element, a temperature of the heating element. The power control module can further determine a temperature of the zone of the substrate support assembly including the heating element based on the determined temperature of the heating element. The determined temperature of the zone can correspond to a temperature of a portion of the substrate.

A system controller can control one or more operating conditions of a process at the processing chamber based on a process recipe. A modification of an operating condition can cause a temperature of a portion of the substrate to change. In some embodiments, the system controller can provide the temperature controller with an indication of an operating condition to be modified from a first setting to a second setting by the system controller. The temperature controller can determine, using a temperature model, whether the modification of the operating condition will cause a temperature of the portion of the substrate to change. In response to determining the modification to the second setting will cause the temperature of the portion of the substrate to change, the temperature controller can modify an amount of power provided to one or more heating elements of the substrate support assembly in order to maintain the temperature of the portion of the substrate at a target temperature. In some embodiments, the temperature controller can provide feedback control of the one or more heating elements. For example, the temperature controller can modify the amount of power provided to the one or more heating elements prior to the modification of the operating condition. In other or similar embodiments, the temperature controller can provide feedforward control of the one or more heating elements. For example, the temperature controller can modify the amount of power provided concurrently with the modification of the operating condition.

Implementations of the present disclosure address the above described deficiencies of the current technology by providing a temperature controller that can obtain accurate, real-time temperature measurements for any heating element embedded in a substrate support assembly. Temperature measurements can be obtained more quickly and with less lag than temperature measurements of traditional temperature sensors. For example, a traditional temperature sensor is spaced apart from a heating element to be measured. It takes time for heat to propagate from the heating element to the temperature sensor in such a system. In contrast, embodiments described herein provide a system in which properties of the heating element itself is used to detect a temperature of the heating element. This provides near instantaneous feedback of a temperature of the heating element.

By providing a system that can obtain temperature measurements more quickly and with less lag, heating elements and/or zones of the substrate support assembly that contribute to a defect can be more quickly identified and rectified. For example, a zone of the substrate support assembly can heat a portion of the substrate to below a target temperature, which can prevent uniform etching process across the surface of the substrate. The temperature controller can more quickly determine the zone of the substrate support assembly is heating the substrate to below the target temperature, and can more quickly cause the temperature of one or more heating elements within the zone to increase the temperature of the substrate to the target temperature. By more quickly identifying heating elements and/or zones to be modified in order to correct defects, a target temperature of the process recipe can be more accurately maintained throughout the process, thereby reducing a number of overall substrate defects. Additionally, in some embodiments separate temperature sensors may be omitted, reducing complexity and/or cost of heaters and/or electrostatic chucks. Furthermore, the temperature module described herein can be used to provide diagnostic for the heating elements. For example, the temperature module can be used alone or together with additional temperature sensors to identify drift in a resistance of the heating elements and/or to identify failing heating elements.

Further, by transmitting DC power to a heating element instead of AC power, more accurate measurements for a voltage and current associated with the heating element can be obtained than could be obtained using AC power. By obtaining more accurate measurements for the voltage and current, a more accurate temperature measurement can be obtained for the heating element and/or a zone including the heating element. As discussed above, by obtaining a more accurate temperature measurement for a heating element and/or a zone including the heating element, the heating element and/or the zone can be more quickly modified to heat the zone to the target temperature, reducing a number of substrate defects. By reducing the number of substrate defects, an overall amount of errors within the system is reduced and an overall system latency is improved.

FIG. 1 is a cross-sectional schematic side view of a processing chamber 100, according to aspects of the present disclosure. Processing chamber 100 can be, for example, a plasma treatment chamber, an etch processing chamber, an annealing chamber, a physical vapor deposition chamber, a chemical vapor deposition chamber, an ion implantation chamber, or another type of processing chamber. The processing chamber 100 includes a chamber body 102, which may be grounded. The chamber body 102 includes walls 104, a bottom 106 and a lid 108 which enclose an internal volume 124. A substrate support assembly 126 is disposed in the internal volume 124 and supports a substrate 134 during processing.

The walls 104 of the processing chamber 100 can include an opening (not shown) through which the substrate 134 can be robotically transferred into and out of the internal volume 124. A pumping port 110 is formed in one of the walls 104 or the bottom 106 of the chamber body 102 and is fluidly connected to a pumping system (not shown). The pumping system can maintain a vacuum environment within the internal volume 124 of the processing chamber 100, and can remove processing byproducts from the processing chamber.

A gas panel 112 can provide process gases and/or other gases to the internal volume 124 of the processing chamber 100 through one or more inlet ports 114 formed through at least one of the lid 108 or walls 104 of the chamber body 102. The process gases provided by the gas panel 112 can be energized within the internal volume 124 to form a plasma 122 utilized to process the substrate 134 disposed on the substrate support assembly 126. The process gases can be energized by RF power inductively coupled to the process gases from a plasma applicator 120 positioned outside the chamber body 102. Alternatively, or additionally, the plasma may be formed in the internal volume 124 of the processing chamber 100. In the embodiment depicted in FIG. 1, the plasma applicator 120 is a pair of coaxial coils coupled through a matching circuit 118 to an RF power source 116.

The substrate support assembly 126 generally includes at least a substrate support 132. The substrate support 132 can be a vacuum chuck, an electrostatic chuck, a susceptor, or other workpiece support surface. In the embodiment of FIG. 1, the substrate support 132 is an electrostatic chuck and will be described hereinafter as the electrostatic chuck 132. The substrate support assembly 126 can also include a cooling base 130. The cooling base 130 can alternately be separate from the substrate support assembly 126. The substrate support assembly 126 can be removably coupled to a support pedestal 125. The support pedestal 125, which can include a pedestal base 128 and a facility plate 180, is mounted to the chamber body 102. The substrate support assembly 126 can be periodically removed from the support pedestal 125 to allow for refurbishment of one or more components of the substrate support assembly 126.

The facility plate 180 is configured to accommodate one or more driving mechanisms configured to raise and lower multiple lifting pins. Additionally, the facility plate 180 is configured to accommodate fluid connections from the electrostatic chuck 132 and the cooling base 130. The facility plate 180 is also configured to accommodate electrical connections from the electrostatic chuck 132 and the heater assembly 170. The myriad of connections can run externally or internally of the substrate support assembly 126, and the facility plate 180 can provide an interface for the connections to a respective terminus.

The electrostatic chuck 132 has a mounting surface 131 and a workpiece surface 133 opposite the mounting surface 131. The electrostatic chuck 132 generally includes a chucking electrode 136 embedded in a dielectric body 150. The chucking electrode 136 can be configured as a mono polar or bipolar electrode, or other suitable arrangement. The chucking electrode 136 can be coupled through a radio frequency (RF) filter 182 to a chucking power source 138 which provides an RF or direct current (DC) power to electrostatically secure the substrate 134 to the upper surface of the dielectric body 150. The RF filter 182 prevents RF power utilized to form a plasma 122 within the processing chamber 100 from damaging electrical equipment or presenting an electrical hazard outside the chamber. The dielectric body 150 can be fabricated from a ceramic material, such as MN or $Al_2O_3$. Alternately, the dielectric body 150 can be fabricated from a polymer, such as polyimide, polyetheretherketone, polyaryletherketone and the like. In some instances, the dielectric body is coated with a plasma resistant ceramic coating, such as Yttria, $Y_3Al_5O_{12}$ (YAG), and so on.

A workpiece surface 133 of the electrostatic chuck 132 can include gas passages (not shown) for providing backside heat transfer gas to an interstitial space defined between the substrate 134 and the workpiece surface 133 of the electrostatic chuck 132. The electrostatic chuck 132 can also include lift pin holes for accommodating lift pins (both not shown) for elevating the substrate 134 above the workpiece surface 133 of the electrostatic chuck 132 to facilitate robotic transfer into and out of the processing chamber 100.

The temperature controlled cooling base 130 is coupled to a heat transfer fluid source 144. The heat transfer fluid source 144 provides a heat transfer fluid, such as a liquid, gas or combination thereof, which is circulated through one or more conduits 160 disposed in the cooling base 130. The fluid flowing through neighboring conduits 160 can be isolated to enable local control of the heat transfer between the electrostatic chuck 132 and different regions of the cooling base 130, which assists in controlling the lateral temperature profile of the substrate 134.

A fluid distributor (not shown) can be fluidly coupled between an outlet of the heat transfer fluid source 144 and the temperature controlled cooling base 130. The fluid distributor operates to control an amount of heat transfer fluid provided to the conduits 160. The fluid distributor can be disposed outside of the processing chamber 100, within the substrate support assembly 126, within the pedestal base 128, or at another suitable location.

The heater assembly 170 can include one or more main resistive heating elements 154 and/or multiple auxiliary heating elements 140 embedded in a body 152 of heater assembly 170 or in the electrostatic chuck 132. In the illustrated example, the main resistive heating elements 154 are disposed above the auxiliary heating elements 140. However, it should be understood that the auxiliary heating elements 140 may additionally or alternatively lie on a same plane as the main resistive heating elements 154 and/or above the main resistive heating elements 154. In one embodiment, the body 152 is a flexible polyimide or other flexibly polymer. In another embodiment, the body is a ceramic such as AlN or $Al_2O_3$. In some embodiments, the body 152 has a disc shape.

The main resistive heating elements 154 can be provided to elevate the temperature of the substrate support assembly 126 and the supported substrate 134 to a temperature specified in a process recipe. The auxiliary heating elements 140 can provide localized adjustments to the temperature profile of the substrate support assembly 126 generated by the main resistive heating elements 154. Thus, the main resistive heating elements 154 operate on a globalized macro scale while the auxiliary heating elements operate on a localized micro scale.

Heater assembly 170 can include multiple heating zones (referred to herein as zones). Each zone can be heated by at least one main resistive heating element 154 and/or at least one auxiliary heating element 140 embedded in the respective zone. In some embodiments, each zone can include one main resistive heating element 154 and one or more auxiliary heating elements 140. In other or similar embodiments, each zone can include multiple main resistive heating elements 154 and multiple auxiliary heating elements 140. In some embodiments, multiple zones may be associated with the same main resistive heating element 154. Heater assembly 170 can include anywhere from two heating zones to hundreds of heating zones (e.g., 150 heating zones or 200 heating zones in some embodiments). Each zone of heater 170 can correspond to a portion of substrate 134. For example, a first zone can heat a first portion of substrate 134 to a first temperature and a second zone can heat a second portion of substrate 134 to a second temperature.

In one embodiment of a two zone configuration of main resistive heating elements 154, the main resistive heating elements 154 can be used to heat the substrate 134 to a temperature suitable for processing with a variation of about +/−10 degrees Celsius from one zone to another. In another embodiment of a four zone configuration of main resistive heating elements 154, the main resistive heating elements 154 can be used to heat the substrate 134 to a temperature suitable for processing with a variation of about +/−1 degrees Celsius within a particular zone. Each zone can vary from adjacent zones from about 0 degrees Celsius to about 20 degrees Celsius depending on process conditions and parameters. In some instances, a half a degree variation of the surface temperature for the substrate 134 can result in as much as a nanometer difference in the formation of structures therein. The auxiliary heating elements 140 can be used to improve the temperature profile of the surface of the substrate produced by the main resistive heating elements 154 by reducing variations in the temperature profile to about +/−0.3 degrees Celsius. The temperature profile can be made uniform or to vary precisely in a predetermined manner across regions of the substrate 134 through the use of the auxiliary heating elements 140 to obtain desired results.

In one embodiment, the heater assembly 170 is included in the electrostatic chuck 132. In other or similar embodiments, the main resistive heating elements 154 and/or the auxiliary heating elements 140 are formed in the electrostatic chuck 132. In such an embodiment, the substrate support assembly 126 can be formed without the heater assembly 170, with the electrostatic chuck 132 disposed directly on the cooling base 130.

The main resistive heating elements 154 can be coupled through an RF filter 184 to a temperature controller 190. In some embodiments, the auxiliary heating elements 140 can be coupled through an RF filter 186 to temperature controller 190. Temperature controller 190 can include a power rectifier 192 and a power control module 194. Temperature controller 190 can be operatively coupled to main power source 156 and auxiliary power source 142. The main power source 156 can provide 900 watts or more power to the main resistive heating elements 154 in embodiments. In some embodiments, the auxiliary power source 142 can provide 10 watts or less power to the auxiliary heating elements 140. In other or similar embodiments, the auxiliary power source 142 can also provide 900 watts or more power to auxiliary heating elements 140. In some embodiments, the power supplied by the auxiliary power source 142 is an order of magnitude less than the power supplied by the main power source 156 of the main resistive heating elements 154. Although main power source 156 and auxiliary power source 142 are illustrated as separate components with respect to FIG. 1, in some embodiments, main power source 156 and auxiliary power source 142 are included in a single component. In other or similar embodiments, main power source 156 and auxiliary power source 142 are included in temperature controller 190.

In some embodiments, the auxiliary heater power source 142 and/or the main heater power source 156 provide alternating current (AC) power to auxiliary heating elements 140 and/or main resistive heating elements 154 (herein collectively referred to as heating elements 154, 140), respectively. In such embodiments, power rectifier 192 can be configured to convert the AC power provided by auxiliary power source 142 and/or the main power source 156 to DC power. In some embodiments, power rectifier 192 is a single-phase rectifier, a three-phase rectifier, or another rectifier. In other or similar embodiments, the auxiliary power source 142 and/or the main power source 156 provide DC power to heating elements 154, 140. In such embodiments, power rectifier 192 can be configured to facilitate the transmission of DC power to heating elements 154, 140.

Power control module 194 can be configured to increase or decrease an amount of power supplied to heating elements 154, 140. Power control module 194 may be, for example, a proportional-integral-derivative (PID) controller. In some embodiments, power control module 194 can measure a voltage across one or more heating element 154, 140. Power control module 194 can further measure a current through one or more the heating element 154, 140. In such embodiments, power control module 194 can determine a temperature of a zone including the heating element 154, 140 based on the measured voltage and current. In particular, power control module 194 or system controller 148 can compute a resistance of a heating element 154, 140 based on the voltage and current measured for that heating element 154, 140 according to the equation:

$$R = V/I$$

where R is resistance of a heating element, V is the voltage across the heating element, and I is the current through the heating element. Each heating element can be calibrated to associate resistance values to temperature values. Accordingly, once a resistance is computed for a heating element, the temperature for that heating element associated with the computed resistance can be determined (e.g., by using a lookup table or function generated during calibration). System controller 148 can be connected to temperature controller 190 via a wired or wireless connection. For example, system controller 148 may be connected to temperature controller 190 via an Ethernet for Control Automation (EtherCAT) connection.

In response to determining the temperature for the zone, power controller 194 can cause an amount of power transmitted from a power source (e.g., auxiliary power source 142, main power source 156) to the heating element to increase or decrease in order to modify the temperature of the zone to a target temperature. Further details regarding the measurement of the voltage and current and control of the power transmitted to the heating element is provided in further detail with respect to FIG. 3.

System controller 148 is coupled to processing chamber 100 to control operation of the processing chamber 100 and processing of the substrate 134. System controller 148 includes a general-purpose data processing system that can be used in an industrial setting for controlling various sub-processors and sub-controllers. Generally, system controller 148 includes a central processing unit (CPU) 172 in communication with memory 174 and input/output (IO) circuitry) 176, among other common components. In some embodiments, system controller 148 controls various conditions within processing chamber 100 in accordance with a process recipe. A process recipe can include a series of software commands to be executed by the CPU during processing of substrate 134. For example, software commands executed by the CPU of the system controller 148 can cause the processing chamber to introduce an etchant gas mixture (i.e., processing gas) into the internal volume 124, form the plasma 122 from the processing gas by application of RF power from the plasma applicator 120, maintain target temperatures, and etch a layer of material on the substrate 134.

A temperature of one or more portions of the surface for the substrate 134 in the processing chamber 100 can be influenced by the various conditions associated with the process recipe. For example, the temperature of the substrate 134 can be influenced by the introduction of an etchant gas mixture into the internal volume 124, the evacuation of the process gases by the pump or a slit valve door, the formation of plasma 122 from the process gas by application of RF power, pressure within the internal volume 124 of the processing chamber 100, the etching of a layer of material on the substrate 134, and other factors. The cooling base 130, the one or more main resistive heating elements 154, and the auxiliary heating elements 140 all help to control the surface temperature of the substrate 134.

Power control module 194 can adjust an amount of power supplied to heating elements 154, 140 in order to maintain a temperature of the substrate 134 at a target temperature during processing. Prior to system control module 148 executing a software command of the process recipe, power controller 194 can modify the amount of power supplied to a heating element 154, 140 in order to counteract an expected change in the temperature the substrate 134 that can occur in response to the execution of the software command. For example, activating RF electrodes in the electrostatic chuck 132 may increase a temperature in one or more zones.

System controller 148 can notify power control module 194 of a software command to be executed by system controller 148, in accordance with the process recipe. Power control module 194 can determine an effect the execution of the software command has on a temperature profile of substrate 134. A temperature of substrate 134 can correspond to a temperature of one or more portions of substrate 134 or a difference in a temperature between two or more portions of substrate 134. In some embodiments, system controller 148 can also determine and/or provide power control module 194 with an indication of an effect on the temperature and/or temperature profile of substrate 134 in response to an execution of the software command. In other or similar embodiments, power control module 194 can identify the effect on the temperature and/or temperature profile of substrate 134. For example, power control module 194 can look up an expected temperature increase or decrease associated with an execution of a command using a lookup table generated during calibration. In another example, power module can provide a current temperature of the substrate and/or a zone of the substrate support assembly and an effect of an operating condition associated with the software command into a temperature model. Based on the effect, power control module 194 or system controller 148 can determine whether to increase, decrease, or maintain an amount of power supplied to one or more of heating elements 154, 140 to maintain the target temperature and/or temperature profile for substrate 134 after the execution of the software command. In response to receiving an instruction to, or determining to, increase or decrease the amount of power supplied to one or more of heating elements 154, 140, power control module 194 can increase or decrease the amount of power supplied to the respective heating elements 154, 140. In some embodiments, power control module 194 can increase or decrease the amount of power supplied to the respective heating elements 154, 140 prior to system controller 148 executing the software command. In other or similar embodiments, power control module 194 can increase or decrease the amount of power supplied to the respective heating elements 154, 140 concurrently with the system controller 148 executing the software command. By increasing or decreasing the amount of power supplied to the respective heating elements 154, 140 prior to or concurrently with the system controller 148 executing the software command, the temperature and/or temperature profile of substrate 134 can be maintained at the target temperature as a condition of the process chamber is modified in accordance with the process recipe. Accordingly, in embodiments power to the heating elements 154, 140 can be adjusted proactively rather than waiting for a temperature change and responding to that temperature change. Accordingly, embodiments provide an increased temperature consistency throughout processing as compared to traditional temperature control techniques.

In some embodiments, body 152 and/or electrostatic chuck 132 can additionally include one or more temperature sensors (not shown). Each temperature sensor can be used to measure a temperature at a zone of heater assembly 170 and/or of a region of an electrostatic chuck 132 associated with a region of the heater assembly 170. A region can encompass multiple zones in an embodiment (e.g., with a single temperature sensor being used for multiple zones). In another embodiment, there is a temperature sensor for each zone. The temperature sensors can provide feedback information to temperature controller 190 and/or system controller 148. In some embodiments, feedback information provided from the temperature sensors can be used to verify a temperature of a heating element 154, 140 and/or the surface of the substrate, in accordance with previously described embodiments. In other or similar embodiments, feedback information provided from the temperature sensors can be used to calibrate or re-calibrate a relationship between a resistance of a heating element 154, 140 and a temperature of the heater, described in further detail herein. Additionally, the temperature sensors can be used to identify failing heating elements.

Figure 2:
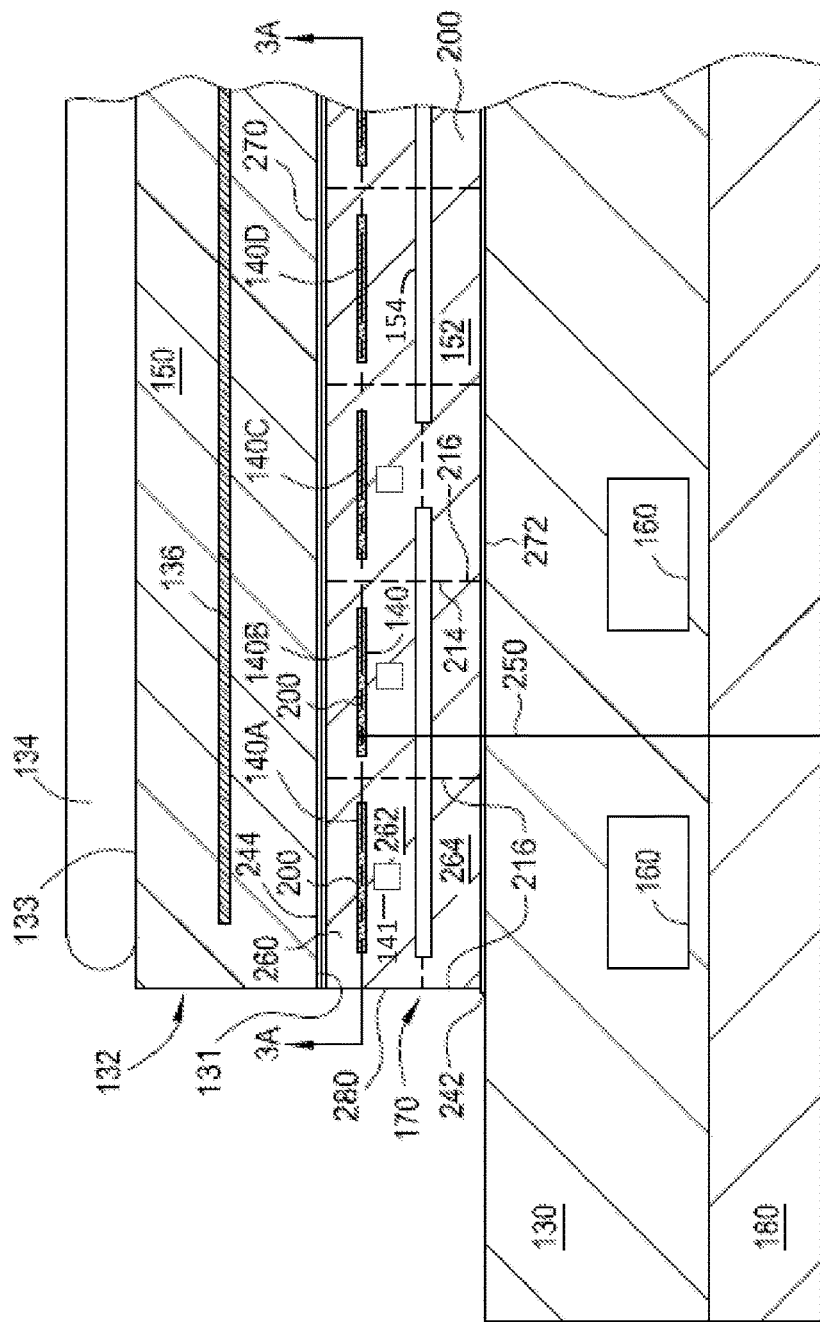
FIG. 2 is a partial cross-sectional schematic side view detailing portions of the substrate support assembly, according to aspects of the present disclosure.

FIG. 2 is a partial cross-sectional schematic side view detailing portions of the substrate support assembly 126, according to aspects of the present disclosure. Included in FIG. 2 are portions of electrostatic chuck 132, cooling base 130, heater assembly 170, and facility plate 180.

The body 152 of the heater assembly 170 can be fabricated from a polymer such as a polyimide or from a ceramic (e.g., aluminum oxide or aluminum nitride). Accordingly, the body 152 can be a flexible body in embodiments and can be rigid in other embodiments. The body 152 can generally be cylindrical, but can also be formed in other geometrical shapes. The body 152 has an upper surface 270 and a lower surface 272. The upper surface 270 faces the electrostatic chuck 132, while the lower surface 272 faces the cooling base 130.

Heating elements 154, 140 can be formed or disposed on or in the body 152 of the heater assembly 170. Alternatively, heating elements 154, 140 can be formed or disposed on or in electrostatic chuck 132. The heating elements 154, 140 can be formed by plating, ink jet printing, screen printing, physical vapor deposition, stamping, wire mesh, pattern polyimide flex circuit, chemical and/or metal lamination, or by other suitable manner. Vias can be formed in the heater assembly 170 or electrostatic chuck 132 for providing connections from the heating elements 154, 140 to an exterior surface of the heater assembly 170 or electrostatic chuck 132. Alternatively, or additionally, a metal layer (not shown) can be formed in the heater assembly 170 or in the electrostatic chuck 132. Vias can be formed in the heater assembly 170 or electrostatic chuck 132 for providing connection from heating elements 154, 140 to the metal layer. Additional vias can be formed that connect the metal layer to an exterior surface of the heater assembly 170 or electrostatic chuck 132.

The heater assembly 170 can include multiple auxiliary heating elements 140, illustratively shown as auxiliary heating elements 140A, 140B, 140C, 140D, and so on. Auxiliary heating elements 140 140 are generally an enclosed volume within the heater assembly 170 in which one or more heating elements 154, 140 effectuate heat transfer between the heater assembly 170 and electrostatic chuck 132. Each auxiliary heating element 140 can be laterally arranged across the heater assembly 170, and define a cell 200 within the heater assembly 170 for locally providing additional heat to one or more zones of the heater assembly 170 aligned with that cell 200. The number of auxiliary heating elements 140 formed in the heater assembly 170 can vary, and it is contemplated that there can be at least an order of magnitude more auxiliary heating elements 140 (and cells 200) greater than the number of the main heating elements 154. In one embodiment in which the heater assembly 170 has four main heating elements 154 (defining four zones of the heater assembly 170), there can be greater than 40 auxiliary heating elements 140. However, it is contemplated that there can be about 200, about 400 or even more auxiliary heating elements 140 in a given embodiment of a substrate support assembly 126 configured for use with a 300 mm substrate.

Similar to heating elements 154, 140, one or more temperature sensors 141 can be formed or disposed on or in the body 152 of the heater assembly 170 or electrostatic chuck 132. The temperature sensors 141 in one embodiment are resistance temperature detectors (RTDs). Alternatively, the temperature sensors 141 can be thermocouples. The temperature sensors 141 can be formed by plating, ink jet printing, screen printing, physical vapor deposition, stamping, wire mesh, pattern polyimide flex circuit, or by other suitable manner. Each temperature sensor 141 can measure a temperature of one or more zones of the heater assembly 170 to determine an operability of one or more heating elements 154, 140 in that zone. In some embodiments, a single temperature sensor 141 can be used to determine the operability of both an auxiliary heating element 140 and a main resistive heating element 154.

Each heating element 154, 140 can be independently coupled to the temperature controller 190. In some embodiments, each temperature sensor 141 can be independently coupled to a temperature controller, such as temperature controller 190 of FIG. 1 (not shown). Temperature controller 190 can regulate the temperature of each heating element 154, 140 of the heater assembly 170. Alternatively, temperature controller 190 can regulate the temperature of a group of heating elements 154, 140 in the heater assembly 170. For example, temperature controller 190 can regulate the temperature of each heating element 154, 140 of a zone of heater assembly 170 relative to the temperature of each heating element 154, 140 of another zone. The temperature controller 190 can control the amount of power delivered to heating elements 154, 140 to control a temperature a zone. For example, temperature controller 190 can provide one or more resistive heating elements 154 ten watts of power, other main resistive heating elements 154 nine watts of power, and one or more auxiliary heating elements 140 one watt of power to control a temperature of a zone including each heating element 154, 140 at a target temperature.

Figure 3:
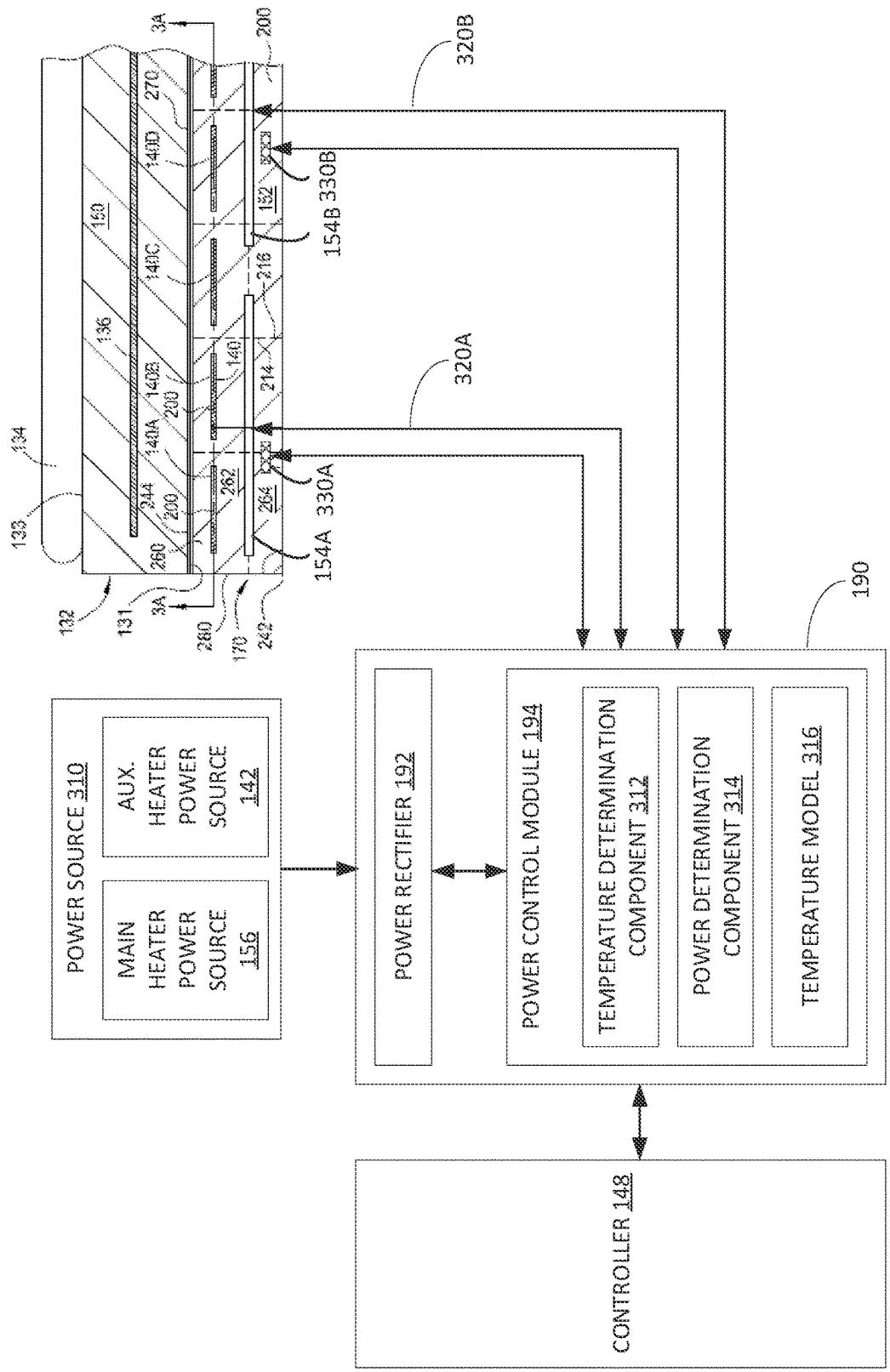
FIG. 3 is a partial cross-sectional schematic side view of the substrate support assembly connected to a temperature controller, according to aspects of the present disclosure.

FIG. 3 is a partial cross-sectional schematic side view of the substrate support assembly 126 connected to a temperature controller 190, according to aspects of the present disclosure. As described above, temperature controller 190 can include at least one of power rectifier 192 and a power control module 194.

Temperature controller 190 can be operatively connected to power source 310. In some embodiments, power source 310 can include main power source 156 and auxiliary power source 142, as described with respect to FIG. 1. In other or similar embodiments, main power source 156 and auxiliary power source 142 can be individual components and can each be separately connected to temperature controller 190, as illustrated in FIG. 1. In some embodiments, power rectifier 192 can be included as a component of power source 310 instead of as a component of temperature controller 190. In other or similar embodiments, power source 310 can be included as a component of temperature controller 190.

As described with respect to FIG. 1, main power source 156 and auxiliary power source 142 can be configured to provide AC power to main resistive heating elements 154 and auxiliary heating elements 140 (collectively referred to as heating elements 154, 140), respectively. In such embodiments, power rectifier 192 can be configured to convert the AC power to DC power. In other or similar embodiments, main power source 156 and auxiliary power source 142 can be configured to provide DC power to heating elements 154, 140, in accordance with previously described embodiments.

Power control module 194 can be configured to increase or decrease an amount of power supplied to one or more heating elements 154, 140. Temperature controller 190 can be connected to one or more heating elements 154, 140 via one or more connectors 320. For example, as illustrated with respect to FIG. 3, temperature controller 190 can be connected to a first main resistive heating element 154a via connector 320a and a second main resistive heating element 154b via connector 320b. In another example, connector 320a can be connected to first main resistive heating element 154a and connector 320b can be connected (not shown) to a first auxiliary heater 140a. Connectors 320 can include a number of connections suitable for communicating between heating elements 154, 140 and temperature controller 190. Connectors 320 can each be a cable, individual wires, a flat flexible cable such as a ribbon, a mating connector, or other suitable technique for transmitting signals between main resistive heating elements 154, 140 and temperature controller 190.

Although FIG. 3 illustrates temperature controller 190 being connected to first main resistive heating element 154*a* and second main resistive heating element 154*b*, temperature controller 190 can be connected to any number of heating elements 154, 140 via any number of connectors 320. For example, temperature controller 190 can be connected to a single heating element 154, 140 via one or more connectors 320. In such example, each heating element 154, 140 embedded within the body 152 of heater assembly 170 can be connected to a separate temperature controller 190. In another example, temperature controller 190 can be connected to each heating element 154, 140 embedded within a zone of the body 152 of heater assembly 170 (i.e., temperature controller 190 controls the power transmitted to each heating element 154, 140 of the zone). In such example, each heating element 154, 140 embedded within the zone can be connected to a single connector 320 or multiple connectors 320.

Connectors 320 can include a number of power leads for each heating element 154, 140 coupled to a connector 320. For example, connector 320*a* can include two or more of separate positive and negative power leads for main resistive heating element 154*a*. In some embodiments, each power lead has a switch managed by power control module 194. Each switch can reside in temperature controller 190, substrate support assembly 126, or another suitable location. The switch can be a field effect transistor, or other suitable electronic switch. The switch can provide simple cycling for heating elements 154, 140 between an energized (active) state and a de-energized (inactive) state. Connectors 320 can provide signals generated by power control module 194 to control the state of a switch.

Power control module 194 can control at least one or more of the duty cycle, voltage, current, or duration of power applied to one or more heating elements 154, 140 relative to another and at the same time. For example, power control module 194 can provide a signal along connector 320*a* to instruct the switch to allow 90% of the power to pass therethrough to main resistive heating element 154*a*. Power signal controller 194 can increase or decrease the duty cycle, voltage, current, or duration of power applied to one or more heating elements 154, 140 in response to a determined temperature of a zone including the heating element 154, 140 and/or an indication of a software command to be executed by system controller 148, in accordance with previously described embodiments.

As described previously, temperature controller 190 can measure a voltage across a heating element 154, 140 and a current through the heating element 154, 140. The measured voltage and current can be used to determine resistance and a temperature of the zone including the heating element. In some embodiments, temperature controller 190 includes one or more sensors (not shown). Each sensor can provide data associated with a heating element 154, 140. Each sensor can include an electrical device that performs electrical measurements of an electrical feed conductor connected to the heating element 154, 140 via a connector 320. The electrical device can sense properties of the electrical feed conductor (e.g., magnetic fluctuations in the electrical feed conductor, electrical current, voltage, etc.) and convert the properties into sensor data. The electrical device can measure sensor data including values of one or more of electrical current, magnitude of AC, phase, waveform (e.g., AC waveform, pulse waveform), DC, non-sinusoidal AC waveforms, voltage, or the like. In alternative embodiments, the sensors are external to the temperature controller 190, and connected to the connectors 320*a*, 320*b*.

In some embodiments, the electrical device can include a clamp that clamps (e.g., via jaws) around an electrical feed conductor. The electrical device can use the clamp to perform electrical measurements of the electrical feed conductor without making physical contact with the electrical feed conductor. In some embodiments, the electrical device can be one or more of a current clamp, a current probe, a CT clamp, an iron vane clamp, a Hall effect clamp, a Rogowski coil current sensor, or the like. In some embodiments, the electrical device includes a first current clamp to clamp around a first service main (e.g., incoming power) and a second current clamp to clamp around a second service main (e.g., outgoing power).

Temperature controller 190 can obtain a voltage value and/or a current value for each of heating element 154, 140 by measuring the voltage and current for DC power transmitted to heating element 154, 140, in accordance with previously described embodiments. In some embodiments, temperature controller 190 can obtain the voltage value and/or the current value for heating element 154, 140 without measuring the voltage and current. For example, temperature controller 190 can receive, from another component of the processing system (e.g., system controller 148) a voltage value and/or a current value for heating element 154, 140. In such embodiments, temperature controller 190 can determine the resistance value for the heating element 154, 140 and a temperature of the zone including the heating element 154, 140, in accordance with embodiments described herein.

Power controller 194 can include a temperature determination component 312 and a power determination component 314. Temperature determination component 312 can be configured to determine a temperature of a zone including one of more heating elements 154, 140 based on voltage and current measurements associated with each heating element 154, 140. As discussed previously, temperature determination component 312 can receive one or more voltage and/or current measurement values associated with a heating element 154, 140. Based on the received voltage and/or current measurement, temperature determination component 312 can determine a resistance value associated with the heating element 154, 140. Temperature determination component 312 can determine the temperature of a zone including the heating element 154, 140 based on a known relationship between the resistance value and a temperature of the zone.

The known relationship between a resistance value of a heating element 154, 140 and a temperature of a zone of the substrate support assembly 126 can be determined prior to, or during, operation of the processing chamber including the substrate support assembly 126. In some embodiments, the known relationship can be determined by power control module 194. In other or similar embodiments, the known relationship can be determined by another component within temperature controller 190 or a component within system controller 148. For purposes of description with respect to FIG. 3, the known relationship will be described as being determined by temperature determination component 312.

A calibration procedure can be performed to determine the relationship between the temperature of the zone and a resistance of a heating element 154, 140 embedded within the zone. The calibration procedure can be performed prior to or after the initiation of operation of the processing chamber. During the calibration procedure, temperature determination component 312 adjusts an amount of power provided to a heating element 154, 140 to generate a series of varying voltage and current measurements for each heating element 154, 140. Each voltage and current measurement can be generated in accordance with previously described embodiments (i.e., providing power to the heating element 154, 140 and receiving values of a voltage measurement and current measurement for with the heating element 154, 140 from a sensor 330). Temperature determination component 312 can determine each resistance value for the heating element 154, 140 based on each voltage and current measurement.

Temperature determination component 312 can further generate a temperature measurement for a zone including the one or more heating elements 154, 140 as each voltage and current measurement is generated. In some embodiments, a calibration object (e.g., a calibration wafer) can be placed on the surface of substrate support assembly 126 prior to the initiation of the calibration procedure. The calibration wafer can include one or more temperature sensors, where each temperature sensor is displaced in a different portion of the calibration wafer. In some embodiments, each temperature sensor of the calibration wafer can have an accuracy of approximately 99% or up to about 99.999%. Each temperature sensor is associated with one or more portions of substrate 134, in embodiments. In other or similar embodiments, each temperature sensor corresponds to a zone of substrate support assembly 136.

As a voltage and current measurement is generated for a heating element 154, 140 embedded within a zone, a temperature measurement is generated from a temperature sensor of the calibration wafer that corresponds to the zone. Responsive to determining a resistance value for the heating element 154, 140, temperature determination component 312 can correlate the determined resistance value to the measured temperature value of the zone.

Temperature determination component 312 can define a relationship between multiple determined resistance values and measured temperature values generated during the calibration procedure. In some embodiments, the relationship between the multiple determined resistance values and the measured temperature values can be stored in a data structure, such as a look up table. In other or similar embodiments, the relationship between the multiple determined resistance values and the temperature measurement values can be defined as a function. In embodiments, each heating element is associated with a unique resistance to temperature data set. In other embodiments, multiple heating elements are associated with a shared resistance to temperature data set. For example, each heating element in a zone may be associated with the same temperature data set.

During operation of the processing chamber, temperature determination component 312 can determine a temperature of a zone based on a determined resistance value of the heating element 154, 140 embedded within the zone and the known relationship between the resistance value and the temperature of the zone. For example, temperature determination component 312 can identify, in a data structure including to the known relationship, a previously measured temperature of a zone including a heating element 154, 140 that corresponds to the determined resistance value of the heating element 154, 140. In another example, the temperature determination component 312 can provide the determined resistance value to the function defined by the known relationship as an input value and obtain, as an output value, a temperature of the zone. The determined temperature of the zone can correspond to a temperature achieved at a corresponding portion of substrate 134.

During operation of the processing chamber, one or more heating elements 154, 140 can degrade, causing a change in the relationship between the temperature of the zone including a heating element 154, 140 and a determined resistance of a heating element 154, 140 embedded within the zone. As described previously, one or more temperature sensors (not shown) can be embedded within the body 152 of heater assembly 170. In some embodiments, the one or more temperature sensors can be used to generate a temperature measurement for a zone of the substrate support assembly 126. A determined temperature of the zone (determined based on a calculated resistance of one or more heating elements 154, 140) can be compared to the measured temperature of the zone generated by the one or more temperature sensors. Temperature controller 190 can determine a difference between the measured temperature and the determined temperature based on the comparison. Temperature controller 190 can determined whether the difference deviates from an expected difference. In response to determining that a difference between the determined temperature and the measured temperature exceeds a threshold difference, temperature controller 190 and/or system controller 148 can modify the relationship between the temperature of the zone and the resistance of a heating element 154, 140 (e.g., provide an indication that the determined resistance value for the heating element 154, 140 corresponds to the first temperature measurement rather than the second temperature measurement). In some embodiments, in response to determining that the difference exceeds the threshold difference, temperature controller 190 and/or system controller 148 can initiate a re-calibration procedure for the substrate support assembly 126. The re-calibration procedure can be the same or similar to the calibration procedure described previously.

In response to temperature determination component 312 determining the temperature of a zone and/or a corresponding portion of substrate 134 (herein referred to as the substrate temperature), power determination component 314 can determine whether to increase or decrease an amount of power supplied to one or more heating elements 154, 140 embedded within the zone. As described previously, system controller 148 can control a process performed within the processing chamber in accordance with a process recipe. The process recipe can include one or more commands to maintain or modify the substrate temperature to a target temperature. Power determination component 314 can determine whether the substrate temperature corresponds to the target temperature, in accordance with the process recipe. In some embodiments, power determination component 314 can determine the substrate temperature corresponds to the target temperature in response to determining that a difference between the substrate temperature and the target temperature satisfies (i.e., meets or falls below) a threshold temperature difference. In similar embodiments, temperature determination component 312 can determine substrate temperature does not correspond to the target temperature of the process recipe in response to determining that the difference between the substrate temperature and the target temperature does not satisfy (i.e., exceeds) a threshold temperature difference. In response to determining the substrate temperature does not correspond to the target temperature of the process recipe, power determination component 314 can cause power control module 194 to increase or decrease an amount of power supplied to one or more heating elements 154, 140 to heat the substrate temperature to the target temperature.

As described previously, a temperature of one or more portions of substrate 134 can be influenced by the various conditions associated with the process recipe. Temperature controller 190 can increase or decrease an amount of power transmitted to a heating element 154, 140 to maintain a target temperature of the heating element 154, 140 as one or more conditions associated with the process recipe are modified. In some embodiments, power control module 194 can determine whether to increase or decrease an amount of power transmitted to a heating element 154, 140 using a temperature model 316. Temperature model 316 can be a model used to identify a target temperature of a zone of heater assembly 170 in response to a modification of one or more various process conditions associated with the process recipe. For example, temperature model 316 can receive, as input, a current temperature of a zone of heater assembly 170 and at least one of a current process setting or a future process setting of the process recipe. Temperature model 316 can provide, as output, a target temperature of the zone of heater assembly 170. In some embodiments, one or more portions of substrate 134 can be heated at a target temperature in accordance with the process recipe in response to one or more heating elements 154, 140 of the zone being maintained at or heated to the target temperature of the zone, as provided by temperature model 316.

In an illustrative example, an ESC can include a radio frequency (RF) electrode used to facilitate generation of plasma during a process in the processing chamber. A heating element 154, 140 embedded within heater assembly 170 can provide a path to ground for the RF electrode. In some instances, a power setting of the RF electrode can cause a change to a temperature of a zone including the embedded heating element 154, 140, thereby changing a temperature of the portion of substrate 134. System controller 148 can provide an indication to temperature controller 190 of a current operating condition, and/or that an operating condition is going to change from a first setting to a second setting. For example, system controller 148 can provide an indication to temperature controller of a current power setting for the RF electrode and/or that a power setting of the RF electrode is going to change from a first setting to a second setting. Temperature determination component 312 can measure a current temperature of the heating element 154, 140 and provide, as input to the temperature model 316, the current temperature of the zone of heater assembly 170 and the change of the power setting of the RF electrode. Temperature model 316 can output a target temperature of the zone of heater assembly 170 to be achieved in response to the change of the power setting of the RF electrode from the first setting to the second setting. Power determination component 314 can determine, based on the target temperature, an amount to increase or decrease the power provided to heating element 154, 140 to achieve the target temperature within the zone of heater assembly 170. In some embodiments, power control module 194 can cause the amount of power provided to heating element 154, 140 to increase or decrease prior to or commensurate with the execution of the software command to modify the power setting of the RF electrode.

FIGS. 4-7 are flow diagrams of various embodiments of methods 400-700 for controlling a temperature of a zone of a substrate support assembly. The methods are performed by processing logic that can include hardware (circuitry, dedicated logic, etc.), software (such as is run on a general purpose computer system or a dedicated machine), firmware, or some combination thereof. Some methods 400-700 can be performed by a computing device, such as system controller 148 or temperature controller 190 of FIG. 1.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events.

FIG. 4 is a flow chart of a method 400 for controlling a temperature of a zone of a substrate support assembly, according to aspects of the present disclosure. In some embodiments, one or more steps of method 400 are performed by temperature controller 190. At block 410, a temperature controller supplies a first direct current (DC) power to a heating element embedded in a zone of a substrate support assembly. At block 420, the temperature controller measures a voltage across the heating element and a current through the heating element.

At block 430, the temperature controller determines a temperature of the zone of the substrate support assembly based on the voltage across the heating element and the current through the heating element. For example, the temperature controller may compute the resistance of the heating element (which is a load for a circuit). The temperature controller may then compare the resistance to a temperature resistance function, table or curve associated with the heating element.

At block 440, the temperature controller determines a target temperature for the zone. The temperature controller additionally compares the determined temperature to the target temperature to determine whether there is any difference or delta there between. If there is a difference, that can mean that the current power being delivered to the heating element is insufficient to achieve the target temperature.

At block 450, the temperature controller can determine a second DC power to deliver to the heating element to achieve the target temperature. The second DC power may be determined at least in part based on the determined temperature difference between the current temperature and the target temperature. The second DC power may be determined, for example, based on the current power being delivered to the heating element and the temperature difference between the current temperature and the target temperature. The temperature controller may access a model that relates input values of current temperature, target temperature and current power to an output power, for example. Temperature controller may input the current temperature, target temperature and current power into the model, and the model may output a new DC power to deliver to the heating element. The model may be a feedforward model, which may also take into consideration (i.e., receive as inputs) current plasma power, target plasma power, current pressure, target pressure, and/or other current and/or target process parameters. Target process parameters may be the same as current process parameters or may be different (e.g., based on adjustments to the process parameters from a process recipe).

At block 460, the temperature controller supplies the second DC power to the heating element to cause the temperature of the zone to be modified to the target temperature.

FIG. 5 is a flow chart of a method 500 for determining a temperature of a zone of a substrate support assembly, according to aspects of the present disclosure. In some embodiments, one or more steps of method 500 are performed by temperature controller 190 or system controller 148. At block 510, processing logic measures a voltage and a current for a heating element. At block 512, processing logic computes a resistance of the heating element using the measured current and voltage. At block 514, processing logic inputs the resistance into a function or a lookup table that relates resistance of the heating element to temperature valves. At block 520, the processing logic determines a temperature for the zone that corresponds to the resistance. In some embodiments, the temperature is a temperature at a zone of a substrate rather than a temperature directly at the heating element. In other embodiments, the temperature is a temperature at the heating element. In such embodiments, processing logic may input the temperature into another lookup table or function that relates temperature of the heating element to temperature of a particular zone of the substrate to determine a temperature at the zone of the substrate.

Figure 6:
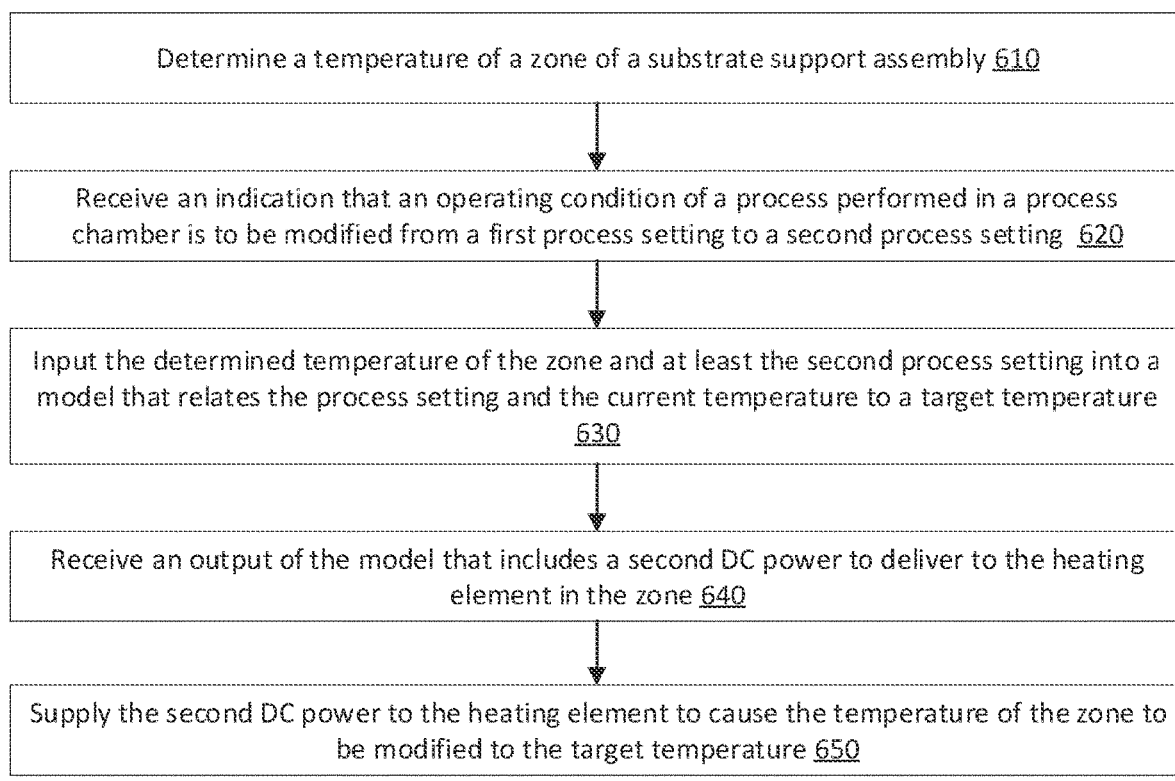
FIG. 6 is a flow chart of a method for determining DC power to deliver to a heating element of a substrate support assembly, according to aspects of the present disclosure.

FIG. 6 is a flow chart of a method 600 for determining DC power to deliver to a heating element of a substrate support assembly, according to aspects of the present disclosure. In some embodiments, one or more steps of method 600 can be performed by temperature controller 190 or system controller 148. At block 610, processing logic determines a temperature of a zone of a substrate support assembly. At block 620, processing logic receives an indication that an operating condition of a process performed in a process chamber is to be modified from a first process setting to a second process setting. For example, a target temperature may be increased from 200 degrees C. to 250 degrees C., plasma power may be increased, process gasses may start flowing that were not previously flowing, and so on.

At block 630, processing logic inputs the determined temperature of the zone and at least the second process setting in to a model that relates the process setting and the current temperature to a target temperature. In an embodiment, processing logic inputs one or more current process settings, one or more future target process settings, a current power delivered to a heating element, a current temperature associated with the heating element (e.g., temperature at a zone of the substrate or temperature of the heating element) and/or a target temperature into the model. At block 640, processing logic receives an output of the model that includes a second DC power to deliver to the heating element in the zone. At block 640, processing logic can supply the second DC power to the heating element to cause the temperature of the zone to be modified to the target temperature.

FIG. 7 is a flow chart of a method 700 for re-calibrating a relationship between a determined resistance of a heating element and a temperature of a zone including the heating element, according to aspects of the present disclosure. In some embodiments, one or more steps of method 700 are performed by temperature controller 190 or system controller 148.

At block 710, processing logic determines a resistance of a heating element based on a measured voltage and current of power transmitted to the heating element. At block 720, processing logic determines, based on the determined resistance of the heating element, a temperature of a zone of a substrate support assembly including the heating element. The temperature of the zone can be determined based on a known relationship between the resistance of the heating element and a previously measured temperature of the zone. The known relationship correlates previously determined resistance values of the heating element to measured temperature values of the zone.

At block 730, processing logic measures the temperature of the zone. The temperature of the zone can be measured using a temperature sensor embedded within the substrate support assembly. At block 740, processing logic compares the determined temperature of the zone to the measured temperature of the zone.

At block 750, processing logic determines a difference between the determined temperature of the zone and the measured temperature of the zone exceeds a threshold difference. In some embodiments, responsive to determining the difference exceeds a threshold difference, processing logic can update a correlation between the determined resistance of the heating element and the temperature of the zone to reflect the measured temperature of the zone. In other or similar embodiments, responsive to determining the difference exceeds a threshold difference, processing logic can re-calibrate the relationship between the resistance of the heating element and the temperature of the zone including the heating element. In such embodiments, processing logic can initiate performance of a calibration process using the calibration object (e.g., the calibration wafer) the processing chamber.

The operations of method 700 can be performed multiple times over an extended time period. During each performance, processing logic can record the difference between the measured temperature of the zone and the determined temperature of the zone. Over the extended time period, processing logic can identify a shift in the difference between the determined temperature and the measured temperature (e.g., a drift). For example, processing logic can determine that, over the extended time period, the difference between the measured temperature of the zone and the determined temperature of the zone increases. Based on the identified shift, processing logic can initiate performance of a calibration process using the calibration object at the processing chamber. In other or similar embodiments, based on the identified shift, processing logic can initiate replacement of one or more heating elements, the temperature controller, and/or the substrate support assembly within the processing system.

Figure 8:
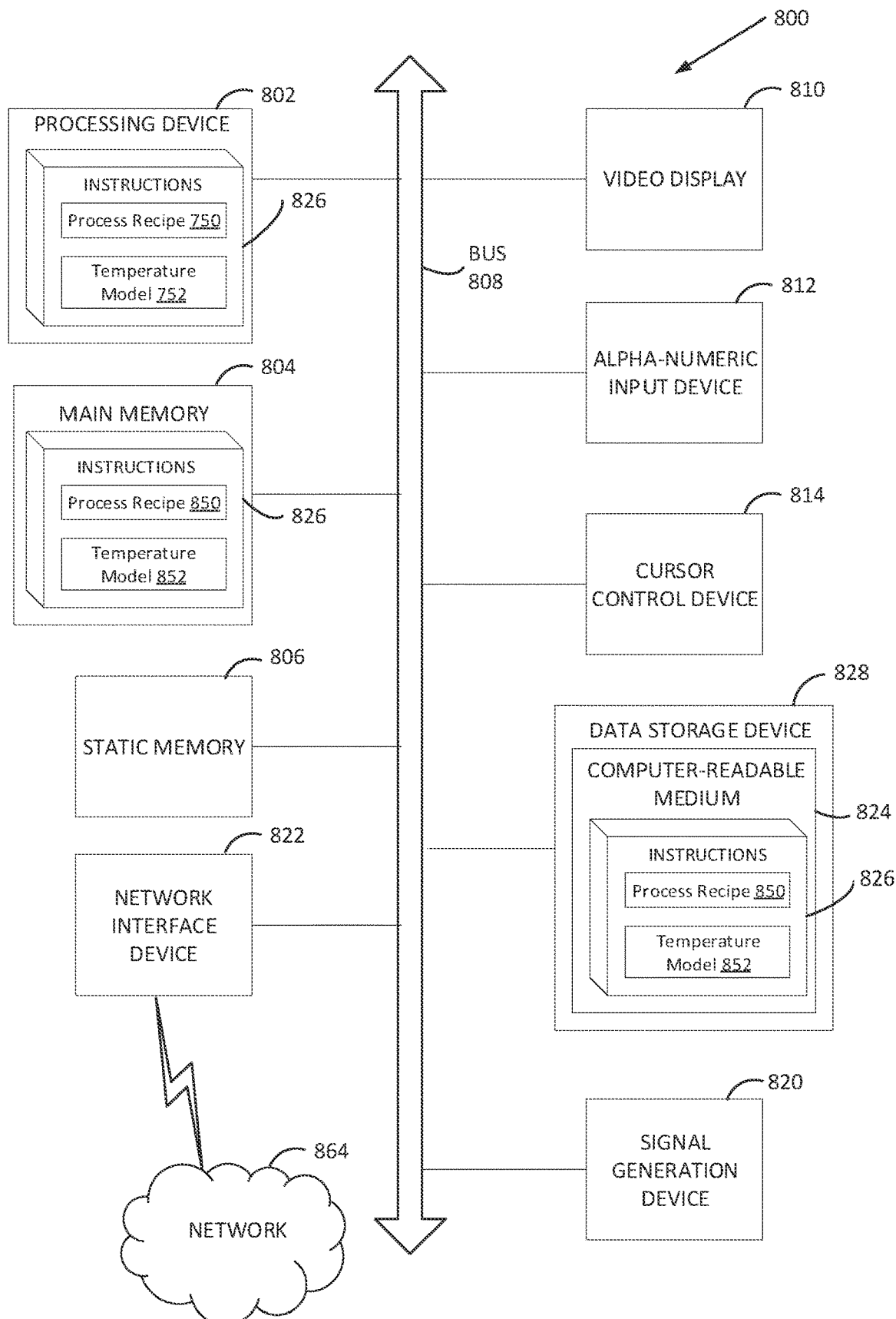
FIG. 8 is a block diagram illustrating a computer system, according to certain embodiments.

FIG. 8 illustrates a diagrammatic representation of a machine in the example form of a computing device 800 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 800 can correspond to temperature controller 190 or system controller 148 of FIG. 1.

The example computing device 800 includes a processing device 802, a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 828), which communicate with each other via a bus 808.

Processing device 802 can represent one or more general-purpose processors such as a microprocessor, central processing unit, or the like. More particularly, the processing device 802 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. Processing device 802 can also be or include a system on a chip (SoC), programmable logic controller (PLC), or other type of processing device. Processing device 802 is configured to execute the processing logic (instructions 826 for mapping recipe 850) for performing operations and steps discussed herein.

The computing device 800 can further include a network interface device 822 for communicating with a network 864. The computing device 800 also can include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 828 can include a machine-readable storage medium (or more specifically a non-transitory computer-readable storage medium) 824 on which is stored one or more sets of instructions 826 embodying any one or more of the methodologies or functions described herein. Wherein a non-transitory storage medium refers to a storage medium other than a carrier wave. The instructions 826 can also reside, completely or at least partially, within the main memory 804 and/or within the processing device 802 during execution thereof by the computer device 800, the main memory 804 and the processing device 802 also constituting computer-readable storage media.

The computer-readable storage medium 824 can also be used to store a mapping recipe 850. The computer readable storage medium 824 can also store a software library containing methods that call mapping recipe 850. While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
  supplying a direct current (DC) power to heating elements embedded in each of a plurality of zones of a substrate support assembly included in a processing chamber;
  determining, based on a voltage measured across the heating elements and a current measured through the heating elements as the DC power is supplied to the heating elements, that a temperature of the substrate support assembly does not satisfy a temperature condition associated with a process recipe for a process at the processing chamber;
  identifying, based on the measured voltage and measured current across the heating elements, a zone of the plurality of zones that is at a temperature that does not correspond to a target temperature for the zone based on the temperature condition; and
  modifying the DC power supplied to the heating elements embedded within the identified zone to cause the temperature of the zone to be modified to the target temperature and the temperature of the substrate support assembly to satisfy the temperature condition.

2. The method of claim 1, wherein determining that the temperature of the substrate support assembly does not satisfy the temperature condition comprises:
  determining the temperature of the substrate support assembly based on the voltage measured across the heating elements and the current measured through the heating elements; and determining that the temperature of the substrate support assembly does not correspond to a substrate temperature for a substrate at the processing chamber.

3. The method of claim 1, further comprising:
receiving an indication that an operating condition of a process performed in the processing chamber is to be modified from a first process setting to a second process setting, wherein the DC power is further modified based at least in part on the second process setting.

4. The method of claim 3, wherein at least one of the heating elements provide a path to ground for a radio frequency (RF) electrode, and wherein a power setting of the RF electrode causes changes to a temperature of the zone, and wherein the operating condition comprises an RF power delivered to the RF electrode.

5. The method of claim 1, further comprising:
transforming an alternating current (AC) power into the DC power using an AC to DC rectifier.

6. The method of claim 1, wherein identifying the zone of the plurality of zones that is at the temperature that does not correspond to the target temperature for the zone comprises:
calculating a temperature of a heating element included in the zone using the voltage across the heating element and the current through the heating element; and
determining that temperature of the heating element does not correspond to the target temperature for the zone.

7. The method of claim 1, further comprising:
computing a resistance of at least one of the heating elements using the voltage across the at least one of the heating elements and the current through the at least one of the heating elements; and
inputting the resistance into at least one of a function or a lookup table that relates resistance of the at least one of the heating elements to temperature values.

8. An apparatus comprising:
a direct current (DC) power source operatively coupled to heating elements embedded in at least one of a plurality of zones of a substrate support assembly included in a processing chamber; and
a controller operatively coupled to the heating element and to the DC power source, wherein the controller is to:
cause the DC power source to supply a first DC power to the heating elements;
determine, based on a voltage measured across the heating elements and a current measured through the heating elements as the DC power is supplied to the heating elements, that a temperature of the substrate support assembly does not satisfy a temperature condition associated with a process recipe for a process at the processing chamber
identify, based on the measured voltage and measured current across the heating elements, a zone of the plurality of zones that is at a temperature that does not correspond to a target temperature for the zone, based on the temperature condition; and
modify the DC power supplied to the heating elements embedded within the identified zone to cause the temperature of the zone to be modified to the target temperature and the temperature of the substrate support assembly to satisfy the temperature condition.

9. The apparatus of claim 8, wherein to determine that the temperature of the substrate support assembly does not satisfy the temperature condition, the controller is to:
determine the temperature of the substrate support assembly based on the voltage measured across the heating elements and the current measured through the heating elements; and
determining that the temperature of the substrate support assembly does not correspond to a substrate temperature for a substrate at the processing chamber.

10. The apparatus of claim 8, wherein the controller is further to:
receiving an indication that an operating condition of a process performed in the processing chamber is to be modified from a first process setting to a second process setting, wherein the DC power is further modified based at least in part on the second process setting.

11. The apparatus of claim 10, wherein at least one of the heating elements provide a path to ground for a radio frequency (RF) electrode, and wherein a power setting of the RF electrode causes changes to a temperature of the zone, and wherein the operating condition comprises an RF power delivered to the RF electrode.

12. The apparatus of claim 8, wherein the DC power source comprises an alternating current (AC) to DC rectifier, and wherein the controller is further to:
cause an alternating current (AC) power to transform into the DC power using an AC to DC rectifier using the AC to DC rectifier.

13. The apparatus of claim 8, wherein to identify the zone of the plurality of zones that is at the temperature that does not correspond to the target temperature for the zone, the controller is to:
calculate a temperature of a heating element included in the zone using the voltage across the heating element and the current through the heating element; and
determine that temperature of the heating element does not correspond to the target temperature for the zone.

14. The apparatus of claim 8, wherein the controller is further to:
compute a resistance of at least one of the heating elements using the voltage across the at least one of the heating elements and the current through the at least one of the heating elements; and
input the resistance into at least one of a function or a lookup table that relates resistance of the at least one of the heating elements to temperature values.

15. An electronics device manufacturing system comprising:
a processing chamber comprising a substrate support assembly, the substrate support assembly comprising heating elements embedded into at least one of a plurality of zones of the substrate support assembly;
a direct current (DC) power source configured to supply DC power to each heating element; and
a controller operatively coupled to each heating element, the DC power source, wherein the controller is to:
cause the DC power source to supply a first DC power to the one or more heating elements;
determine, based on a voltage measured across the heating elements and a current measured through the heating elements as the DC power is supplied to the heating elements, that a temperature of the substrate support assembly does not satisfy a temperature condition associated with a process recipe for a process at the processing chamber
identify, based on the measured voltage and measured current across the heating elements, a zone of the plurality of zones that is at a temperature that does not correspond to a target temperature for the zone, based on the temperature condition; and modify the DC power supplied to the heating elements embedded within the identified zone to cause the temperature of the zone to be modified to the target temperature and the temperature of the substrate support assembly to satisfy the temperature condition.

16. The electronics device manufacturing system of claim 15, wherein to determine that the temperature of the substrate support assembly does not satisfy the temperature condition, the controller is to:

determine the temperature of the substrate support assembly based on the voltage measured across the heating elements and the current measured through the heating elements; and determine that the temperature of the substrate support assembly does not correspond to a substrate temperature for a substrate at the processing chamber.

17. The electronics device manufacturing system of claim 15, wherein the controller is further to:

receive an indication that an operating condition of a process performed in the processing chamber is to be modified from a first process setting to a second process setting, wherein the DC power is further modified based at least in part on the second process setting.

18. The electronics device manufacturing system of claim 17, wherein at least one of the heating elements provide a path to ground for a radio frequency (RF) electrode, and wherein a power setting of the RF electrode causes changes to a temperature of the zone, and wherein the operating condition comprises an RF power delivered to the RF electrode.

19. The electronics device manufacturing system of claim 15, wherein the DC power source comprises an alternating current (AC) to DC rectifier, and wherein the controller is further to:

cause an alternating current (AC) power to transform into the DC power using an AC to DC rectifier using the AC to DC rectifier.

20. The electronics device manufacturing system of claim 15, wherein to identify the zone of the plurality of zones that is at the temperature that does not correspond to the target temperature for the zone, the controller is to:

calculate a temperature of a heating element included in the zone using the voltage across the heating element and the current through the heating element; and determine that temperature of the heating element does not correspond to the target temperature for the zone.

* * * * *